United States Patent
Cao et al.

(10) Patent No.: US 11,056,287 B2
(45) Date of Patent: Jul. 6, 2021

(54) ISODIKETOPYRROLOPYRROLE DYE AND USE THEREOF

(71) Applicant: SOUTH CHINA UNIVERSITY OF TECHNOLOGY, Guangdong (CN)

(72) Inventors: Derong Cao, Guangdong (CN); Xufeng Zang, Guangdong (CN)

(73) Assignee: SOUTH CHINA UNIVERSITY OF TECHNOLOGY, Guangdong (CN)

(*) Notice: Subject to any disclaimer, the term of this patent is extended or adjusted under 35 U.S.C. 154(b) by 375 days.

(21) Appl. No.: 15/747,766

(22) PCT Filed: Dec. 31, 2015

(86) PCT No.: PCT/CN2015/100048
§ 371 (c)(1),
(2) Date: Jan. 26, 2018

(87) PCT Pub. No.: WO2017/016177
PCT Pub. Date: Feb. 2, 2017

(65) Prior Publication Data
US 2018/0226201 A1 Aug. 9, 2018

(30) Foreign Application Priority Data
Jul. 28, 2015 (CN) .......................... 201510449724.9

(51) Int. Cl.
*H01G 9/20* (2006.01)
*C09B 57/00* (2006.01)
*H01L 51/00* (2006.01)

(52) U.S. Cl.
CPC ......... *H01G 9/2059* (2013.01); *C09B 57/004* (2013.01); *C09B 57/008* (2013.01);
(Continued)

(58) Field of Classification Search
CPC .. H01G 9/2004; H01G 9/2022; H01G 9/2031; H01G 9/2059; H01G 9/2013;
(Continued)

(56) References Cited

U.S. PATENT DOCUMENTS

2011/0094579 A1* 4/2011 Yamada ................ H01L 51/445
136/256
2015/0213966 A1* 7/2015 Holcombe .......... C09B 23/0058
252/500

FOREIGN PATENT DOCUMENTS

CN 102893422 1/2013
CN 104403351 3/2015
(Continued)

OTHER PUBLICATIONS

Qu et al., New Diketopyrrolopyrrole (DPP) Dyes for Efficient Dye-Sensitized Solar Cells, 2010, J Phys Chem, 114, 1343-1349 (Year: 2010).*
(Continued)

*Primary Examiner* — Eli S Mekhlin
*Assistant Examiner* — Dujuan A Horton
(74) *Attorney, Agent, or Firm* — JCIPRNET

(57) ABSTRACT

The present invention discloses an isodiketopyrrolopyrrole dye and use thereof. A series of pure organic dye based on isodiketopyrrolopyrrole are synthesized in the present invention, using 4,4'-dihexyloxytriphenylamine as an electron donor, isodiketopyrrolopyrrole as a π-bridge, and cyanoacetic acid as an electron acceptor and an anchoring group, and with a alkyl chain introduced on an isodiketopyrrolopyrrole group. The types of dyes have a relatively good light-harvesting performance as well as a relatively large steric hindrance, and they are not easy to gather while being absorbed on a semiconducting film. The pure organic dye with isodiketopyrrolopyrrole as an electronic π-bridge, which is used in a dye-sensitized solar cell, has a good (Continued)

ability of inhibiting the recombination of electrons, and the dye-sensitized solar cells have a high photoelectric conversion efficiency.

3 Claims, 1 Drawing Sheet

(52) U.S. Cl.
CPC ......... *H01G 9/2004* (2013.01); *H01G 9/2022* (2013.01); *H01L 51/0025* (2013.01); *H01L 51/0053* (2013.01); *H01L 51/0061* (2013.01); *H01L 51/0068* (2013.01); *H01G 9/2013* (2013.01); *H01G 9/2031* (2013.01); *Y02E 10/542* (2013.01); *Y02P 70/50* (2015.11)

(58) Field of Classification Search
CPC . C09B 57/004; C09B 57/008; H01L 51/0068; H01L 51/0053; H01L 51/0061; H01L 51/0025; Y02E 10/542; Y02E 10/549; Y02P 70/50

See application file for complete search history.

(56) References Cited

FOREIGN PATENT DOCUMENTS

| CN | 104530747 | 4/2015 |
| CN | 105131640 | 12/2015 |
| WO | 2014033582 | 3/2014 |

OTHER PUBLICATIONS

Lu et al., 3,6-Dithiophen-2-yl-diketopyrrolo[3,2-b]pyrrole (isoDPPT) as an Acceptor Building Block for Organic Opto-Electronics, 2013, Macromolecules, 46, 3895-3906 (Year: 2013).*
"International Search Report (Form PCT/ISA/210)", dated Apr. 1, 2016, with English translation thereof, pp. 1-4.

* cited by examiner

ISODIKETOPYRROLOPYRROLE DYE AND USE THEREOF

CROSS-REFERENCE TO RELATED APPLICATION

This application is a 371 application of International PCT application serial no. PCT/CN2015/100048, filed on Dec. 31, 2015, which claims the priority benefit of China application no. 201510449724.9, filed on Jul. 28, 2015. The entirety of each of the abovementioned patent applications is hereby incorporated by reference herein and made a part of this specification.

BACKGROUND OF THE INVENTION

1. Technical Field

The present invention relates to the technical fields of an organic dye and a dye-sensitized solar cell, and particularly relates to an isodiketopyrrolopyrrole dye and use thereof.

2. Background

A long-term and large-scale use of fossil energy resource, not only leads to an increasing shortage of the fossil energy resource which will result in exhaustion in the future, but also brings environmental problems that are hard to be managed. Therefore, developing and utilizing a sustainable and clean energy such as solar energy and the like have attracted an extensive attention of science researchers around the world. Particularly, dye-sensitized solar cell (DSSC) is one of the representatives of a photovoltaic industry and it has been rapidly developed in recent two decades. A sensitized dye is an important component of the cell, and directly influences the performances and a practical use of the cell. The sensitized dye can be classified into two categories: a pure organic dye and a metal complex dye. The metal complex dye has a superiority of a high photoelectric conversion efficiency, while the pure organic dye also has characteristics such as a good structural adjustability, being easy to be synthesized and separated, and a relatively low cost, which make the pure organic dye also competitive.

In particular, the pure organic dye based on diketopyrrolopyrrole (DPP) is not only has an excellent light-harvesting performance and a relatively wide light coverage area, but also has a good photochemical property, a good photostability and a good chemical stability, and it has a relatively good development potential. DPP has an isomeride which has a highly similar structure, i.e. isodiketopyrrolopyrrole (isoDPP). The only difference between them is that positions of carbonyls and nitrogen atoms in the lactim bonds are different. Until now, there aren't any reports of the pure organic dye based on isoDPP. A type of pure organic dye is designed and synthesized in the present invention, using 4,4'-dihexyloxytriphenylamine as an electron donor, isodiketopyrrolopyrrole as a π-bridge, and cyanoacetic acid as an electron acceptor and an anchoring group. The dye has advantages such as a simple structure, being easy to be synthesized, a good photoelectric conversion performance and so on.

SUMMARY OF THE INVENTION

The present invention discloses a dye which is based on isodiketopyrrolopyrrole as a π-bridge and use thereof in a dye-sensitized solar cell. A new type of a metal-free pure organic photosensitive dye is synthesized in the present invention. This type of dye is a pure organic dye that has 4,4'-dihexyloxytriphenylamine as an electron donor, isodiketopyrrolopyrrole as a π-bridge, and cyanoacetic acid as an electron acceptor and an anchoring group, and an alkyl chain is introduced on an isodiketopyrrolopyrrole group. This type of dye has a good application performance in the dye-sensitized solar cell. A general structural formula of the dye is as follows:

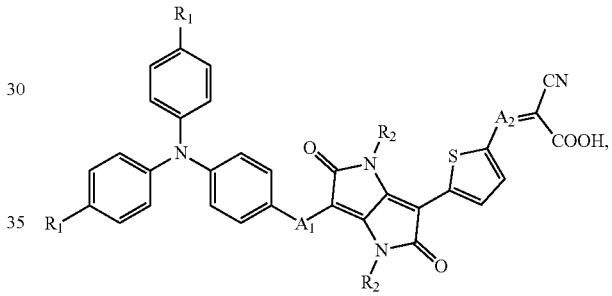

wherein, $R_1$ and $R_2$ are selected from a group consisting of $C_1$-$C_{20}$ linear alkyls, $C_1$-$C_{20}$ branched alkyls and $C_1$-$C_{20}$ alkoxys, and $R_1$ and $R_2$ may be the same or different; $A_1$ and $A_2$ are selected from a group consisting of a thiophene, a benzene ring, a furan, 3,4-ethylenedioxythiophene and a pyrrole, and $A_1$ and $A_2$ may be the same or different.

A synthesis method of the dye which is based on isodiketopyrrolopyrrole as the π-bridge according to the present invention is simple, and raw materials are cheap and easy to obtain. For example, synthesis steps of the dye are as follows:

when $R_1$ is an n-hexyloxy, $R_2$ is an isooctyl, and $A_1$ and $A_2$ are phenyls, a synthesis route is as follows:

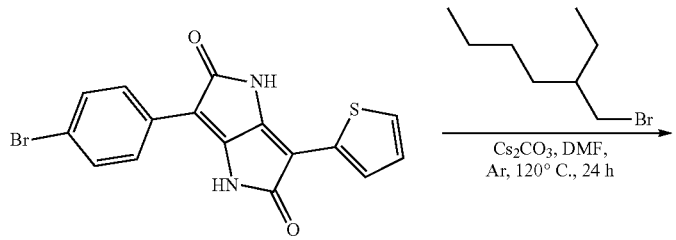

-continued
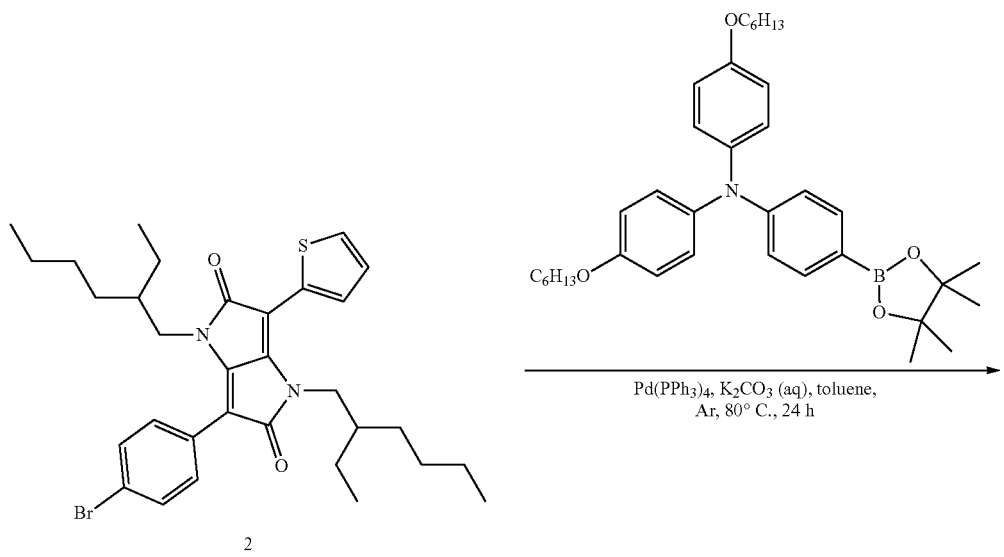
2
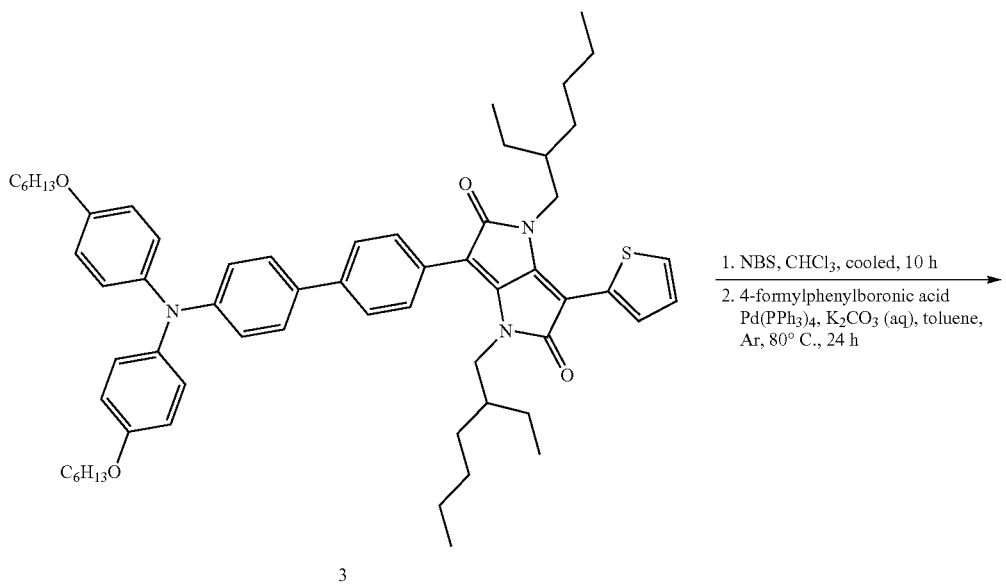
3

-continued
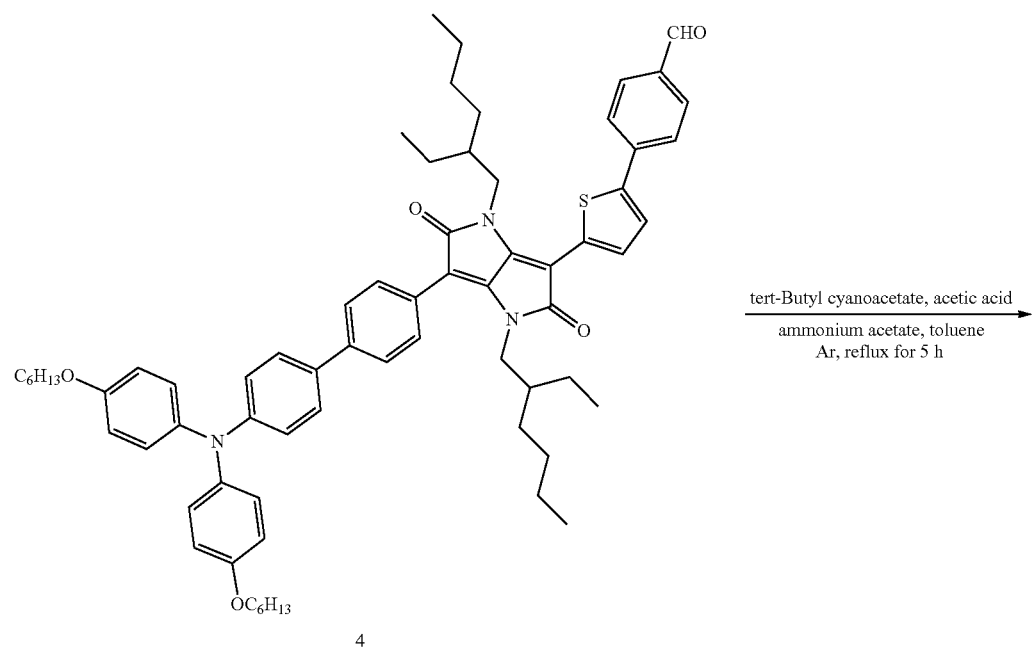
tert-Butyl cyanoacetate, acetic acid
ammonium acetate, toluene
Ar, reflux for 5 h
4
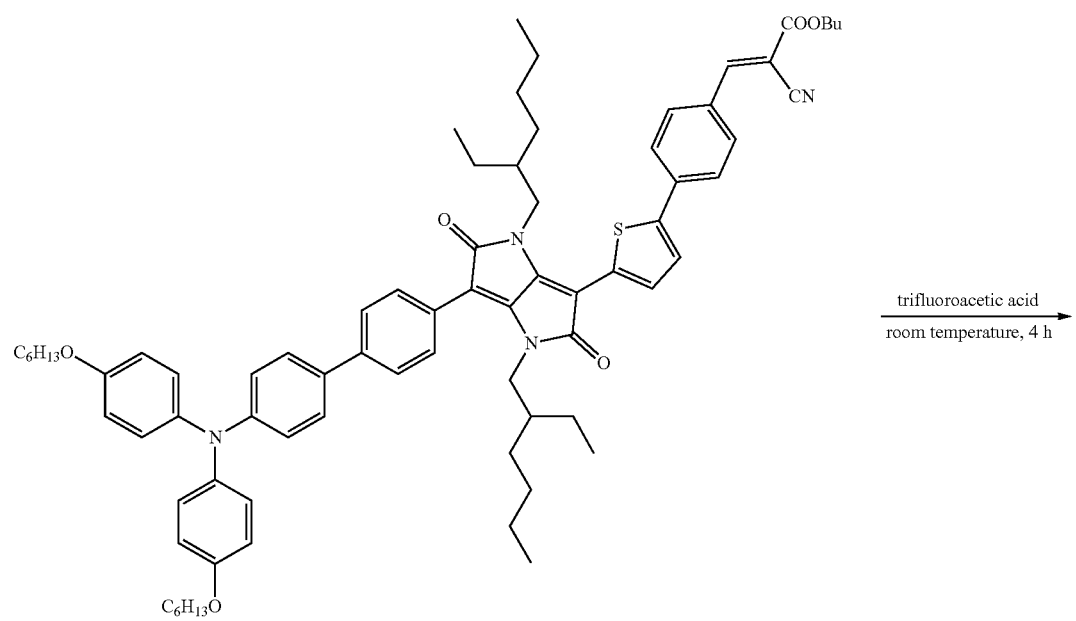
trifluoroacetic acid
room temperature, 4 h
5

-continued

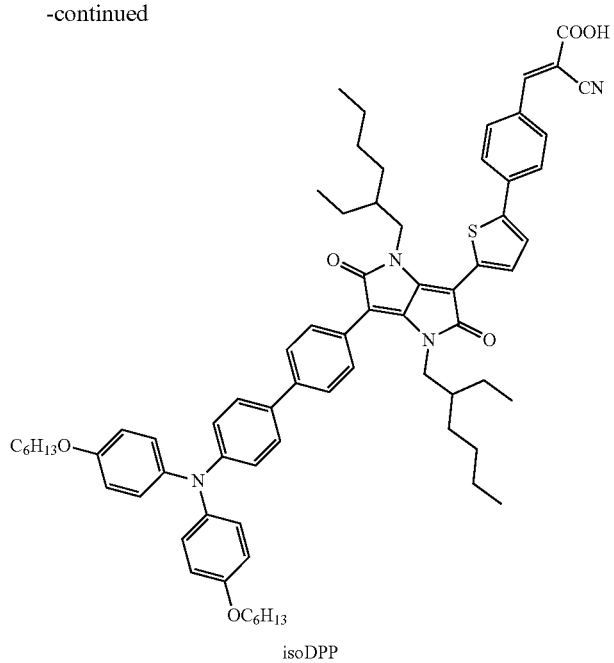

isoDPP

A synthesis method of Compound 2:

taking DMF as a solvent, heating Compound 1 and 3 parts of Cs$_2$CO$_3$ up to 60° C. in an oil bath and stirring for 1 hour under an atmosphere of Ar; slowly injecting 6 parts of a DMF solution of bromo-isooctane into the above-described reaction solution; heating the oil bath up to 120° C. and continuing the reaction for 24 hours after the injection is finished; cooling, adding water into the reaction flask, extracting with dichloromethane, washing an organic layer with water, drying, concentrating a crude product and obtaining Compound 2 by a column chromatography.

A synthesis method of Compound 3:

taking toluene as a solvent, adding the above-described Compound 2, 2 parts of 4,4'-dihexyloxytriphenylamine borate, 8% parts of Pd(PPh$_3$)$_4$ and 2 parts of 2 M K$_2$CO$_3$ aqueous solution thereto; heating up to 80° C. in the oil bath for reacting for 19 h under the atmosphere of Ar; cooling, adding water into the reaction flask, extracting with dichloromethane, washing an organic layer with water, drying, concentrating a crude product and obtaining Compound 3 by the column chromatography.

A synthesis method of Compound 4:

taking THF as a solvent, adding Compound 3 thereto, cooling to 0° C., and then adding 1.5 parts of NBS away from light, natural reacting to a normal temperature for 12 h; pouring into water, adding dichloromethane for an extraction, washing an organic layer with water, drying, concentrating and obtaining a crude product by column chromatography. Then transferring the crude product, taking toluene as a solvent, and adding 2 parts of 4-formylphenyl-boronic acid, 8% parts of Pd(PPh$_3$)$_4$ and 2 parts of 2 M K$_2$CO$_3$ aqueous solution thereto; heating up to 80° C. in the oil bath for reacting for 24 h under the atmosphere of Ar; cooling, adding water into the reaction flask, extracting with dichloromethane, washing an organic layer with water, drying, concentrating a crude product and obtaining Compound 4 by the column chromatography.

A synthesis method of Compound 5:

taking toluene as a solvent, adding Compound 4, 2 parts of t-butyl cyanoacetate, 2 parts of ammonium acetate and 2 mL of acetic acid thereto; heating the reaction solution in the oil bath under the atmosphere of Ar for reflux reaction for 5 h; pouring into cold water, adding dichloromethane for extraction, washing an organic layer with water, drying, concentrating, and obtaining Compound 5 by separating and purifying a crude product with the chromatography.

A synthesis method of a dye isoDPP:

taking trifluoroacetic acid as a solvent, adding Compound 4 thereto and reacting under stirring at a room temperature for 4 h; pouring into deionized water, collecting a solid by filtering after the solid precipitating out, and repeatedly washing with deionized water until a pH value of a liquid generated by washing shows neutral, and drying.

Use of the isodiketopyrrolopyrrole dye synthesized in the present invention in the dye-sensitized solar cells, comprises a constitution and a structure, preparation steps and a cell performance test of the dye-sensitized solar cells:

(1) The constitution and the structure of the dye-sensitized solar cells: consisting of five components which are a conductive glass substrate (which generally is a fluorine-doped SnO$_2$ transparent conductive glass, i.e. FTO), a photoanode, a sensitizer, an electrolyte and a counter electrode (which generally is a platinum-plating conductive glass); wherein a nano-porous TiO$_2$ film that can be used to absorb the dye is provided in the middle of the conductive glass on one side of a substrate work zone of the photoanode; the counter electrode is also called a photocathode, a catalyst layer is provided in the middle of the conductive glass on one side of a substrate work zone of the photocathode, wherein the catalyst is usually Pt; the photoanode and the photocathode are alternately configured opposite, the nano-porous TiO$_2$ film is sealed peripherally with a sealing material to form an airtight cavity, and the airtight cavity is filled with the electrolyte and the sensitizer (i.e. the isodiketopyrrolopyrole dye).

(2) The preparation steps of the dye-sensitized solar cells:

1) pretreatment of a conductive glass (FTO): ultrasonic cleaning a cut FTO and washing for 3-6 times with deionized water, and then soaking in a saturated ethanol solution of KOH for 16-36 h, followed by ultrasonic cleaning sequentially with deionized water, acetone, deionized water and ethanol, and keeping for use after drying;

2) preparation of a photoanode: at room temperature, adding 35-80 mL of acetic acid and deionized water under intensive stirring to a mixed solution of 10-25 mL of $Ti(OBu)_2$ and 15-30 mL of EtOH, and continue to stir for 30 min to 2 h, transferring the mixed solution into an autoclave which is lined with Teflon (polytetrafluoroethylene), treating at 200-280° C. for 8-20 h followed by natural cooling to room temperature, filtering an obtained suspension, sequentially washing for 3-6 times with deionized water and ethanol, drying in an oven at 40-60° C. for 4-8 h until dry to obtain $TiO_2$ nanocrystalline particles, respectively adding ethanol, acetic acid, terpilenol and ethyl cellulose into the prepared $TiO_2$ nanocrystalline particles, grinding the mixture thoroughly to obtain a muddy substance, and obtaining a white sticky $TiO_2$ nanocrystalline slurry as required though ultrasonic processing;

making a conducive plane of the treated conductive glass upward, placing a screen mesh sheet above the glass, controlling an off-contact distance to be 0.5-3 cm, placing the prepared $TiO_2$ nanocrystalline slurry on the screen mesh sheet to perform printing; controlling a thickness of the $TiO_2$ film according to need, and the thickness about 8-20 μm (with an area of 2-4 mm×2-4 mm) being used, putting the prepared photoanode into an oven for drying at 100-150° C., and then putting into a muffle furnace for sequential treatment at different temperatures (baking at 300-350° C. for 3-10 min, baking at 300-400° C. for 3-10 min, baking at 400-500° C. for 10-20 min, and baking at 450-550° C. for 10-20 min) to fully remove an organic substance on the film, and subsequently soaking into a prepared 0.1-0.3 M $TiCl_4$ aqueous solution to treat for 30 min to 1.5 h, washing clean with deionized water and ethanol after the treatment is finished, putting into the muffle furnace and heating up to 450-550° C. to bake again for 25-40 min, and cooling to 60-80° C. for use;

3) preparation of a dye solution: dissolving the isodiketopyrrolopyrrole dye said in claim 1 into a mixed solvent of chloroform/methanol (v/v=4/1-1/4) to formulate a dye solution of $1\times10^{-4}$ mol·$L^{-1}$ to $3\times10^{-4}$ mol·$L^{-1}$;

4) preparation of an electrolyte solution: dissolving 0.5-0.7 M 1-methyl-3-propylimidazolium iodide (PMII), 0.03-0.07 M guanidine thiocyanate, 0.03-0.07 M LiI, 0.01-0.04 M $I_2$ and 0.15-0.40 M tert-butyl pyridine (TBP) into acetonitrile, and mixing uniformly to obtain a clear solution;

5) sensitization of the photoanode: soaking the photoanode prepared in step 2l into the dye solution prepared in step 3), taking the photoanode out and washing with the mixed solvent of chloroform/methanol (v/v=4/1-1/4) to remove the residual on the surface or the dye on a film after performing a dye bath in a dark environment for 10-20 hours, and blow-drying followed by keeping the photoanode in a dry and dark environment for packaging and use; and 6) making an adhesive tape into a suitable inner hole plastic by using a hole puncher, putting an insulative thin film on the sensitized photoanode to enable the photoanode to be exactly inside an inner hole of the insulative thin film, dropping 1-2 drops of the electrolyte solution prepared in step 4) onto a surface of the $TiO_2$ film, and covering a platinum counter electrode on the photoanode with two sides being fixed with clamps, and then an open dye-sensitized solar cell to be tested is formed.

More preferably, the preparation steps of the dye-sensitized solar cell comprise particular steps as follows:

a. the pretreatment of the conductive glass (FTO): ultrasonic cleaning a cut FTO (2-4 cm×5-10 cm) and washing for several times with deionized water, and then soaking in the saturated ethanol solution of KOH for 24 h, followed by ultrasonic cleaning sequentially with deionized water, acetone, deionized water and ethanol, and keeping for use after drying;

b. the preparation of the photoanode: at room temperature, adding 50 mL of acetic acid and deionized water under intensive stirring to a mixed solution of 15 mL of $Ti(OBu)_2$ and 20 mL of EtOH, and continue to stir for 1 h, transferring the mixed solution into the autoclave which is lined with Teflon (polytetrafluoroethylene), treating at 230° C. for 12 h followed by natural cooling to room temperature, filtering an obtained suspension, sequentially washing for several times with deionized water and ethanol, drying in the oven at 50° C. for 6 h until dry to obtain the $TiO_2$ nanocrystalline particles, respectively adding ethanol, acetic acid, terpilenol and ethyl cellulose into the prepared $TiO_2$ nanocrystalline particles, grinding the mixture thoroughly to obtain a muddy substance, and obtaining a white sticky $TiO_2$ nanocrystalline slurry as required through ultrasonic processing;

making the conducive plane of the treated conductive glass upward, placing a screen mesh sheet above the glass, controlling an off-contact distance to be 1 cm, placing the prepared $TiO_2$ nanocrystalline slurry on the screen mesh sheet to perform printing; controlling the thickness of the $TiO_2$ film according to need, and the thickness about 17 μm (with an area of 4 mm×4 mm) being used in this experiment; putting the prepared photoanode into the oven for drying at 125° C., and then putting into the muffle furnace for sequential treatment at different temperatures (baking at 325° C. for 5 min, baking at 375° C. for 5 min, baking at 450° C. for 15 min, and baking at 500° C. for 15 min) to fully remove the organic substance on the film, and subsequently soaking into a prepared 0.2 M $TiCl_4$ aqueous solution to treat for half an hour, washing clean with deionized water and ethanol after the treatment is finished, putting into the muffle furnace and heating up to 500° C. to bake again for 30 min, and cooling to 70° C. for use;

c. the preparation of the dye solution: dissolving the isodiketopyrrolopyrrole dye into a mixed solvent of chloroform/methanol (v/v=1/1) to formulate a dye solution of $2\times10^{-4}$ mol·$L^{-1}$;

d. the preparation of the electrolyte solution: an acetonitrile solution of 0.6 M 1-methyl-3-propylimidazolium iodide (PMII), 0.05 M guanidine thiocyanate, 0.05 M LiI, 0.03 M $I_2$ and 0.25 M tert-butyl pyridine (TBP);

e. the sensitization of the photoanode: soaking the photoanode prepared in step b into the dye solution prepared in step c, taking the photoanode out and washing with the mixed solvent of chloroform/methanol (v/v=1/1) to remove the residual on the surface or the dye on the film surface after performing the dye bath in the dark environment for 15 h, and blow-drying followed by keeping the photoanode in the dry and dark environment for packaging and use; and f. making an adhesive tape into a suitable inner hole plastic by using the hole puncher, putting the insulative thin film on the sensitized photoanode to enable the photoanode to be exactly inside an inner hole of the insulative thin film, dropping 1-2 drops of the electrolyte solution (prepared in step d) onto the surface of the $TiO_2$ film, and covering the platinum counter electrode on the photoanode with two sides being fixed with clamps, and then the open sensitized-dye solar cell to be tested is formed.

(3) The cell performance test: respectively leading wires from the photoanode and the photocathode of the cell to a cell performance testing device, with a work area of the cell of 0.16 $cm^2$, stimulating the sunlight with a solar simulator, adjusting a light intensity to 100 mW/cm$^2$, and testing a J-V curve based on the dye-sensitized cell.

Compared with the prior art, the present invention has advantages and technical effects as follows:

by introducing the isodiketopyrrolopyrrole groups in the π-bridge, a spectral response can be enlarged, an aggregation of the dye and a recombination of electrons can be effectively restrained, a lifetime of the electrons can be prolonged, and a photoelectric conversion efficiency of the sensitized solar cells can be improved.

DETAILED DESCRIPTION OF THE PREFERRED EMBODIMENT

Figure 1:
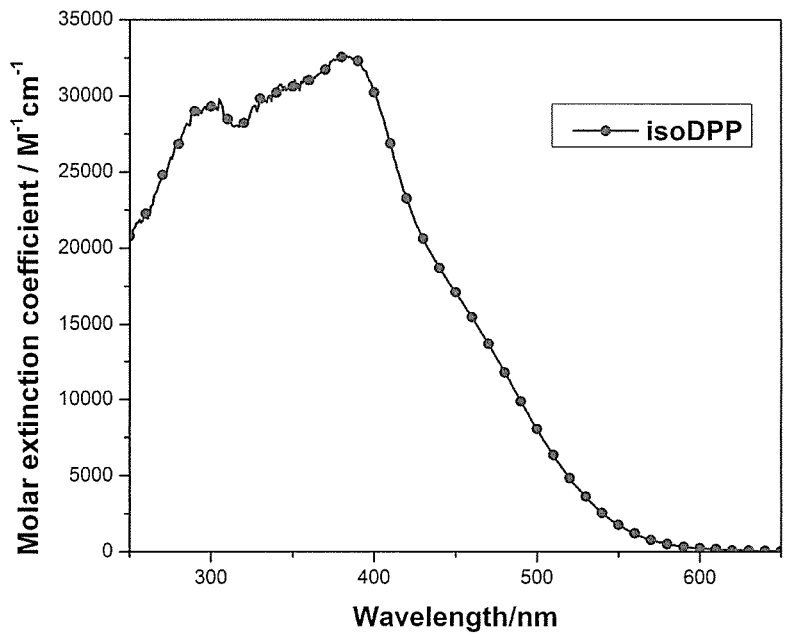
FIG. 1 is a UV/visible absorption spectrum of a dye synthesized in embodiment 1 in a mixed solution of 4-tertiary butanol/acetonitrile (v/v=1/1).

The present invention will be described in further details below by combining embodiments, but the scope that the present invention seeks for protection shall be not limited by the scope represented by the embodiments.

Embodiment 1

A synthesis of a dye isoDPP with a π-bridge containing isodiketopyrrolopyrrole (1) A synthesis of Compound 2

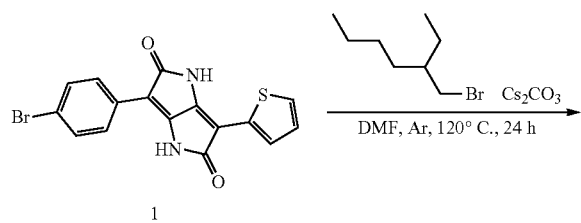

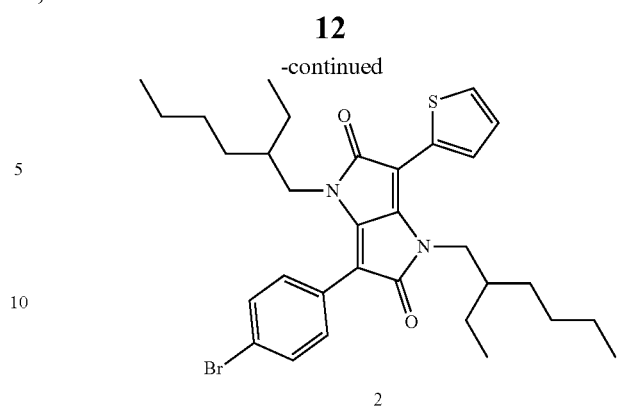

Compound 1 (2.33 g, 6.25 mmol), Cs$_2$CO$_3$ (6.11 g, 18.74 mmol) and 30 mL of dry DMF were respectively added into a 100 mL two-neck reaction flask. The air in a device was pumped out by a vacuum pump, and Ar was filled in the device. An oil bath was heated up to 60° C., and a reaction solution was stirred for 1 hour. A DMF (7 mL) solution of bromo-isooctane (7.24 g, 37.50 mmol) was injected into the above-described reaction solution by a disposable syringe. After the injection was finished, the oil bath was heated up to 120° C. and the reaction was continued for 24 hours. The reaction solution was cooled to room temperature after the reaction was finished. A diluted hydrochloric acid solution was added to the reaction solution under stirring to adjust a pH value of the solution to be neutral. The reaction solution was extracted with 3×50 mL of Dichloromethane, combined with an organic phase, and washed with a saturated salt solution followed by being dried with an anhydrous sodium sulfate. Dichloromethane was removed by a rotary evaporation. A residual was a crude product of Intermediate 2, and the crude product was directly used in the next reaction after being separated by a column chromatography.

(2) A synthesis of Compound 3

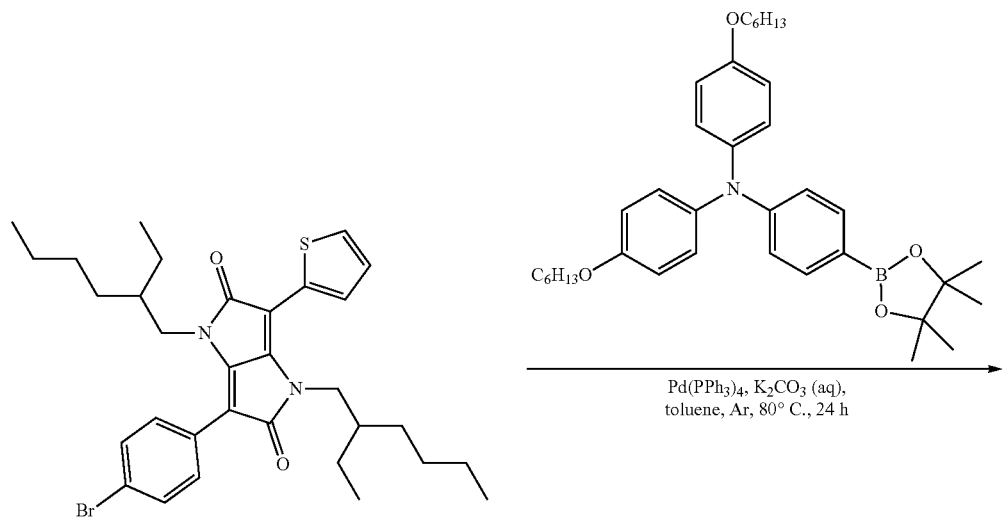

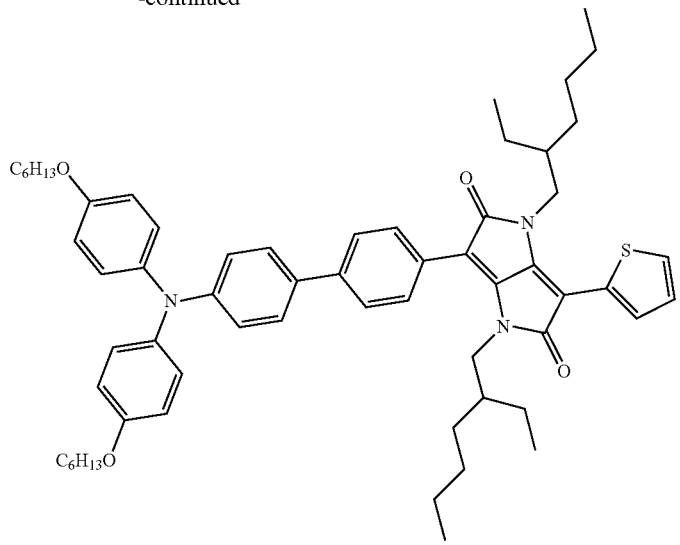

3

The above-described Compound 2, 4,4'-dihexyloxytriphenylamine borate (1.49 g, 2.60 mmol), Pd(PPh₃)₄ (125.00 mg, 0.11 mmol), 2M K₂CO₃ aqueous solution (2.20 mL) and 30 mL of a redistilled toluene were added respectively into a 50 mL two-neck reaction flask. The air in the device was pumped out by the vacuum pump, and Ar was filled in the device. The oil bath was heated up to 80° C. for reacting for 19 hours. The reaction mixture was cooled to room temperature after the reaction was finished, and was poured into water. The reaction mixture was extracted with 3×50 mL of Dichloromethane, combined with the organic phase, and washed with the saturated salt solution followed by being dried with the anhydrous sodium sulfate. Dichloromethane was removed by the rotary evaporation. A residual was separated and purified by a silica gel column chromatography with petroleum ether (bp 60-90° C.) and ethyl acetate (v/v=20:1) as eluents, and was vacuum dried to obtain an orange-red solid 3 (0.11 g, 0.01 mmol). The total yield of synthesizing Compound 2 and Compound 3 in these two steps was 0.16%. A melting point of Compound 3 was 149-151° C.

$^1$H NMR (CDCl₃, 400 MHz, ppm): δ 8.22 (s, 1H), 7.79-7.76 (m, 1H), 7.63 (d, J=8.0 Hz, 2H), 7.51-7.49 (m, 1H), 7.47-7.39 (m, 4H), 7.08 (d, J=8.0 Hz, 4H), 6.99 (d, J=8.0 Hz, 2H), 6.84 (d, J=8.0 Hz, 4H), 3.94 (t, J=6.0 Hz, 4H), 3.85-3.55 (m, 4H), 1.80-1.77 (m, 4H), 1.58 (s, 9H), 1.49-1.40 (m, 4H), 1.37-1.32 (m, 12H), 1.20-1.15 (m, 8H), 0.94-0.88 (m, 6H), 0.82-0.74 (m, 9H), 0.65-0.60 (m, 3H).

(3) A synthesis of Compound 4

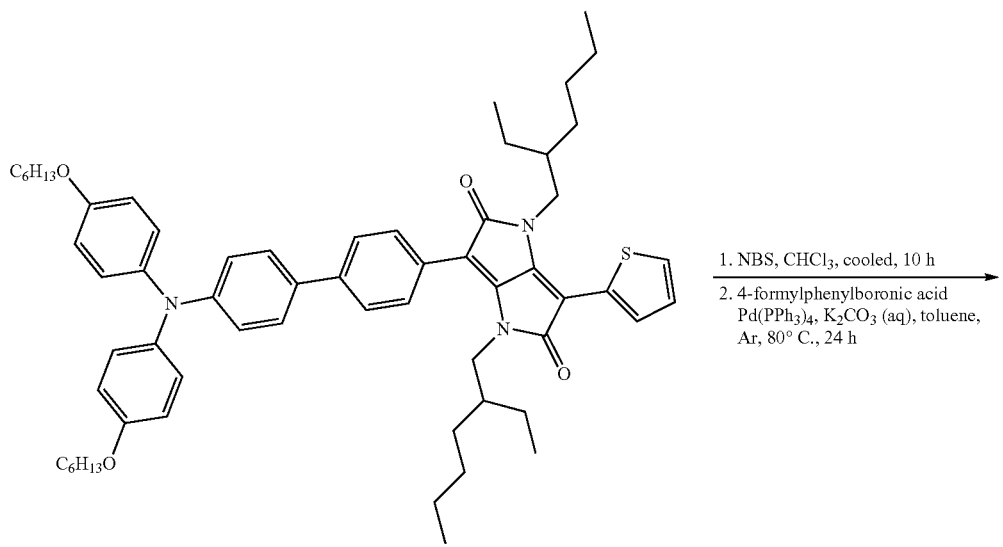

1. NBS, CHCl₃, cooled, 10 h
2. 4-formylphenylboronic acid
   Pd(PPh₃)₄, K₂CO₃ (aq), toluene,
   Ar, 80° C., 24 h

3

-continued

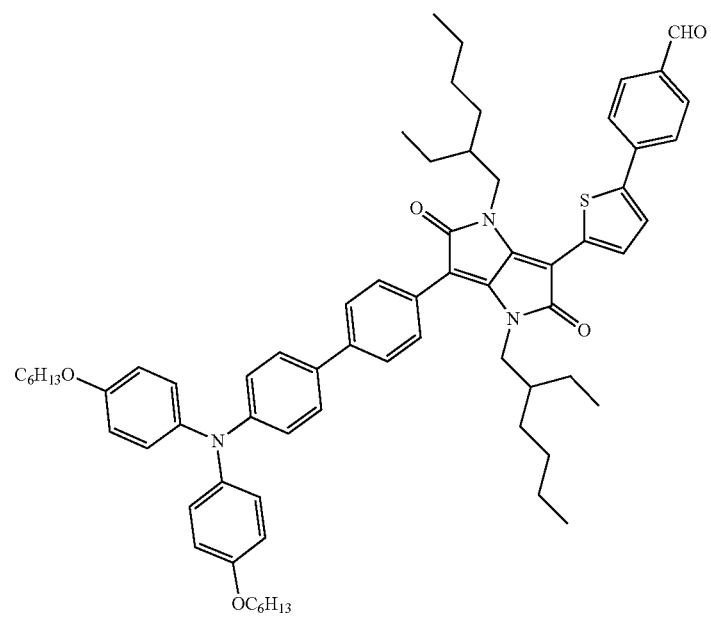

4

Intermediate 3 (0.65 g, 0.68 mmol) and 25 mL of tetrahydrofuran were added into a 50 mL single-neck flask and were stirred for 15 minutes in an ice bath, followed by an addition of NBS (0.18 g, 1.01 mmol) away from light and continuing the reaction in the ice bath for 1 hour, and then the reaction was transferred for reacting for 10 hours at room temperature. After the reaction was finished, the reaction solution was poured into water. The reaction mixture was extracted with 3×50 mL of Dichloromethane, combined with the organic phase, and washed with the saturated salt solution followed by being dried with the anhydrous sodium sulfate. Dichloromethane was removed by the rotary evaporation. A residual was transferred to a 50 mL two-neck flask, and 4-formylphenylboronic acid (0.11 g, 72.00 mmol), Pd(PPh$_3$)$_4$ (58.00 mg, 0.05 mmol), 2M K$_2$CO$_3$ aqueous solution (0.50 mL) and 20 mL of the redistilled toluene were added. The air in the device was pumped out by the vacuum pump, and Ar was filled in the device. The oil bath was heated up to 80° C. for reacting for 24 hours. After the reaction was finished, the reaction solution was poured into water. The reaction mixture was extracted with 3×50 mL of Dichloromethane, combined with the organic phases, and washed with the saturated salt solution followed by being dried with the anhydrous sodium sulfate. Dichloromethane was removed by the rotary evaporation. A residual was separated and purified by the silica gel column chromatography with petroleum ether (bp 60-90° C.) and ethyl acetate (v/v=50:1) as the eluents, and was vacuum dried to obtain a red solid 4 (0.34 g, 0.32 mmol). The yield was 47.1%, and the melting point was 114-116° C.

$^1$H NMR (CDCl$_3$, 400 MHz, ppm): δ 9.97 (s, 1H), 7.87 (d, J=7.2 Hz, 2H), 7.76 (d, J=7.2 Hz, 2H), 7.63-7.59 (m, 2H), 7.49-7.40 (m, 5H), 7.39-7.34 (m, 1H), 7.08 (d, J=8.0 Hz, 4H), 7.00-6.96 (m, 2H), 6.84 (d, J=7.9 Hz, 4H), 3.95-3.89 (m, 4H), 3.82-3.75 (m, 2H), 3.65-3.60 (m, 2H), 1.83-1.75 (m, 4H), 1.50-1.43 (m, 4H), 1.38-1.32 (m, 8H), 1.26-0.97 (m, 18H), 0.94-0.89 (m, 6H), 0.82-0.72 (m, 9H), 0.65-0.60 (m, 3H).

(4) A synthesis of Compound 5

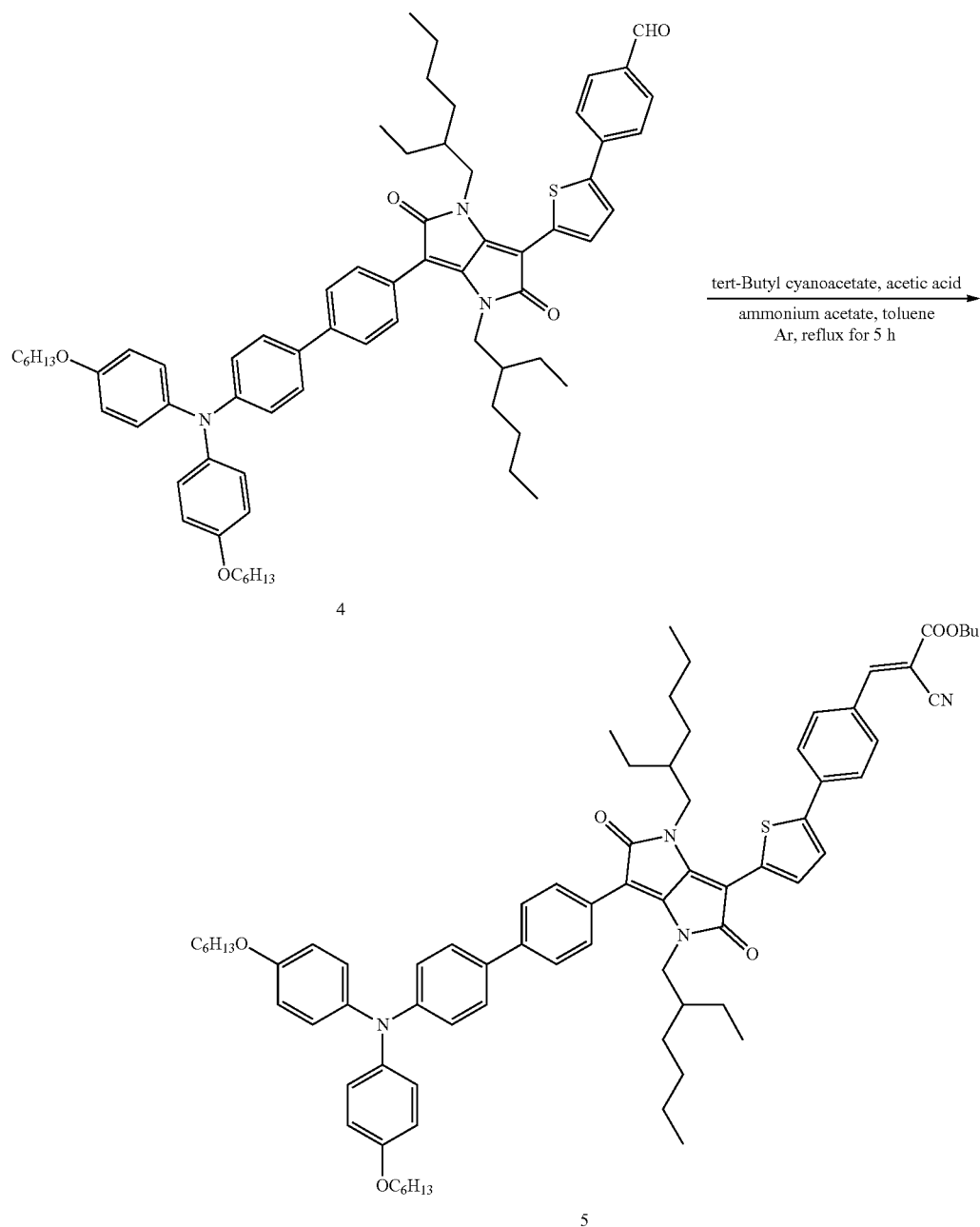

Intermediate 4 (0.25 g, 0.235 mmol), t-butyl cyanoacetate (66.00 mg, 0.47 mmol), ammonium acetate (36.00 mg, 0.47 mmol), acetic acid (2 mL) and 25 mL of toluene were added into a 50 mL two-neck flask. The air in the device was pumped out by the vacuum pump, and Ar was filled in the device. The reaction solution was heated up in the oil bath for a reflux reaction for 5 hours. The reaction solution was cooled to room temperature after the reaction was finished, and was poured into water. The reaction solution was extracted with 3×50 mL of Dichloromethane, combined with the organic phase, and washed with the saturated salt solution followed by being dried with the anhydrous sodium sulfate. Dichloromethane was removed by the rotary evaporation. A residual was separated and purified by the silica gel column chromatography with petroleum ether (bp 60-90° C.) and ethyl acetate (v/v=20:1) as the eluents, and was vacuum dried to obtain a red solid 5 (0.25 g, 0.213 mmol). The yield was 90.7%, and the melting point was 123-125° C.

$^1$H NMR (CDCl$_3$, 400 MHz, ppm): δ 8.01 (s, 1H), 7.87 (d, J=7.6 Hz, 2H), 7.59 (d, J=7.6 Hz, 2H), 7.49 (d, J=7.6 Hz, 2H), 7.37-7.24 (m, 6H), 6.95 (d, J=8.0 Hz, 4H), 6.86 (d, J=7.6 Hz, 2H), 6.71 (d, J=8.0 Hz, 4H), 3.83-3.77 (m, 4H), 3.74-3.64 (m, 2H), 3.57-3.40 (m, 2H), 1.70-1.60 (in, 4H), 1.47 (s, 9H), 1.39-1.35 (in, 4H), 1.28-1.20 (m, 8H), 1.14-0.90 (m, 18H), 0.81-0.75 (in, 6H), 0.70-0.60 (m, 9H), 0.55-0.45 (m, 3H).

(4) A synthesis of Compound 6

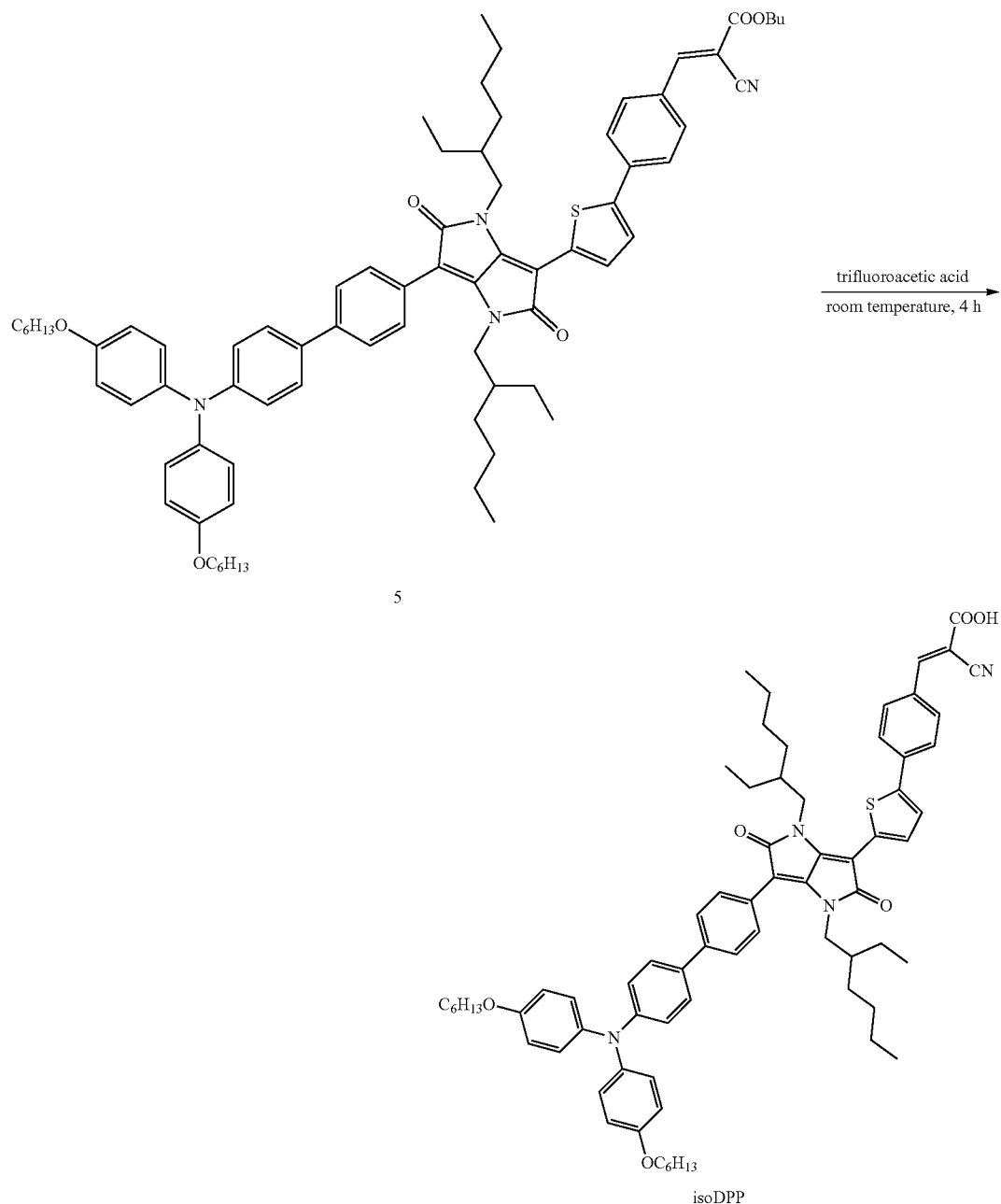

Intermediate 5 (0.13 g, 0.109 mmol) and trifluoroacetic acid (8 mL) were added into a 25 mL single-neck flask and were stirred for 4 hours at a normal temperature. The reaction solution was poured into 100 mL of deionized water after the reaction was finished. After a solid precipitated out, the solid was collected by filtering, and was repeatedly washed with deionized water until a pH of liquid generated by washing showed neutral. The solid was dried to obtain a black solid dye isoDPP (103.00 mg, 0.091 mmol). The yield was 83.8%, and the melting point was 127-129° C.

$^1$H NMR (THF-$d_8$, 400 MHz, ppm): δ 8.24 (s, 1H), 8.13-8.09 (m, 2H), 7.87 (d, J=8.0 Hz, 2H), 7.69-7.64 (m, 3H), 7.53-7.45 (m, 5H), 7.04 (d, J=8.0 Hz, 4H), 6.95 (d, J=8.0 Hz, 2H), 6.84 (d, J=8.0 Hz, 4H), 3.99-3.92 (m, 4H), 3.88-3.84 (m, 2H), 3.70-3.64 (m, 2H), 1.81-1.74 (m, 4H), 1.52-1.46 (m, 4H), 1.40-1.34 (m, 8H), 1.25-1.14 (m, 10H), 1.09-1.00 (m, 8H), 0.95-0.90 (m, 6H), 0.81-0.73 (m, 9H), 0.65-0.61 (m, 3H).

Embodiment 2

A UV-visible absorption spectrum test was performed on the dye obtained in Embodiment 1. The UV-visible absorption spectrum is shown in FIG. 1.
Solvent: a mixed solution of 4-tertiary butanol/acetonitrile (v/v=1/1)
Concentration: $2 \times 10^{-5}$ M
Temperature: room temperature
Device: Shimadzu UV-2450 UV-vis spectrophotometer.

It can be seen from FIG. 1 that the dye isoDPP only shows one absorption peak while the peak presents a relatively wide coverage area, different from most of the pure organic dyes in the mixed solution of 4-tertiary butanol/acetonitrile (v/v=1/1). All of the molar extinction coefficients in a range of 400-490 nm exceed 10,000 $M^{-1}cm^{-1}$, which indicates that the dye has a good light-harvesting ability.

Embodiment 3

A preparation of the dye-sensitized solar cell of the present invention is shown as follows:

(1) Pretreatment of a conductive glass (FTO): a cut FTO (2 cm×5 cm) was ultrasonic cleaned and washed for 4 times with deionized water, and then was soaked in a saturated ethanol solution of KOH for 24 hours. Then the cut FTO was sequentially ultrasonic cleaned with deionized water, acetone, deionized water and ethanol, and was held for use after being dried;

(2) Preparation of a photoanode: at room temperature, 50 mL of acetic acid and deionized water were added to a mixed solution of 15 mL of $Ti(OBu)_2$ and 20 mL of EtOH under intense stirring, and kept on stirring for 1 h. The mixed solution was transferred into an autoclave which is lined with Teflon (polytetrafluoroethylene) for being treated at 230° C. for 12 h, and naturally cooled to room temperature. An obtained suspension was filtered, sequentially washed for 4 times with deionized water and ethanol, and dried in an oven at 50° C. for 6 h until dry to obtain $TiO_2$ nanocrystalline particles. 1 mL of ethanol, 0.5 mL of acetic acid, 1.2 mL of terpilenol and 1.6 mL of ethyl cellulose were respectively added into the prepared $TiO_2$ nanocrystalline particles, the mixture was grinded thoroughly to obtain a muddy substance. A white sticky $TiO_2$ nanocrystalline slurry as required was obtained through ultrasonic processing.

A conducive plane of the treated conductive glass was made upward, a screen mesh sheet was placed above the glass, an off-contact distance was controlled to be 1 cm, and the prepared $TiO_2$ nanocrystalline slurry was placed on the screen mesh sheet to perform printing. A thickness of the $TiO_2$ film was controlled according to need, and the thickness was about 17 μm (with an area of 4 mm×4 mm) used in this chapter experiment. The prepared photoanode was put into an oven for drying at 125° C., and then put into a muffle furnace for treating sequentially at different temperatures (baking at 325° C. for 5 minutes, baking at 375° C. for 5 minutes, and baking at 450° C. for 15 minutes, baking at 500° C. for 15 minutes) to remove an organic substance on the film. Then the prepared photoanode was soaked into a prepared 0.2 M $TiCl_4$ aqueous solution to treat for half an hour, washed clean with deionized water and ethanol after the treatment was finished, and put into the muffle furnace and heated up to 500° C. to bake again for 30 minutes, and cooled to 70° C. for use;

(3) Preparation of a dye solution: the isodiketopyrrolopyrrole dye prepared in Embodiment 1 was dissolved into a mixed solvent of chloroform/methanol (v/v=1:1) to formulate a dye solution of $2×10^{-4}$ mol·$L^{-1}$;

(4) Preparation of an electrolyte solution: 0.6 M 1-methyl-3-propylimidazolium iodide (PMII), 0.05 M guanidine thiocyanate, 0.05 M LiI, 0.03 M $I_2$ and 0.25 M tert-butyl pyridine (TBP) were dissolved into acetonitrile, and mixed to obtain a uniform and stable solution;

(5) Sensitization of the photoanode: the photoanode prepared in the step (2) was soaked into the dye solution prepared in the step (3). After taking a dye bath in a dark environment for 10-20 hours, the photoanode was taken out and washed with the mixed solvent of chloroform/methanol (v/v=1:1) to remove the residual on the surface or the dye physically absorbed on the surface of the film. After being blow-dried, the photoanode was kept in a dry and dark environment for packaging and use; and (6) An adhesive tape was made into a suitable inner hole plastic by using a hole puncher, and the insulative thin film was put on the sensitized photoanode to enable the photoanode to be exactly inside an inner hole of the insulative thin film. 1-2 drops of the electrolyte solution prepared in the step (4) were dropped onto a surface of the $TiO_2$ film, and a platinum counter electrode was covered on the photoanode with two sides being fixed with clamps. Then an open dye-sensitized solar cell to be tested was formed.

(7) A cell performances test: wires were respectively led from the photoanode and the photocathode of the cell to a cell performance testing device, with a work area of the cell of 0.16 $cm^2$. The sunlight was stimulated with a solar simulator, a light intensity was adjusted to 100 mW/$cm^2$, and a J-V curve based on the dye-sensitized cell was tested.

Embodiment 4

A performance test of the dye-sensitized solar cell:
According to the preparation steps in Embodiment 3, the dyes synthesized in Embodiment 1 were respectively assembled into a cell, and the wires were led from the photoanode and the photocathode to the cell performance testing device, with the work area of 0.16 $cm^2$. The sunlight was stimulated with the solar simulator, a light intensity was adjusted to 100 mW/$cm^2$, and the J-V curve based on the dye-sensitized cell was respectively tested.

The data of a figure of the J-V curve tested (FIG. 2) were gathered in Table 1.

TABLE 1

Performance data of the dyes of Embodiment 1 used in the dye-sensitized solar cell

| dye | short-circuit current (mA/$cm^2$) | open-circuit voltage (mV) | fill factor | photoelectric conversion efficiency (%) |
|---|---|---|---|---|
| Embodiment 1 | 12.83 | 776 | 0.61 | 6.11 |

Figure 2:
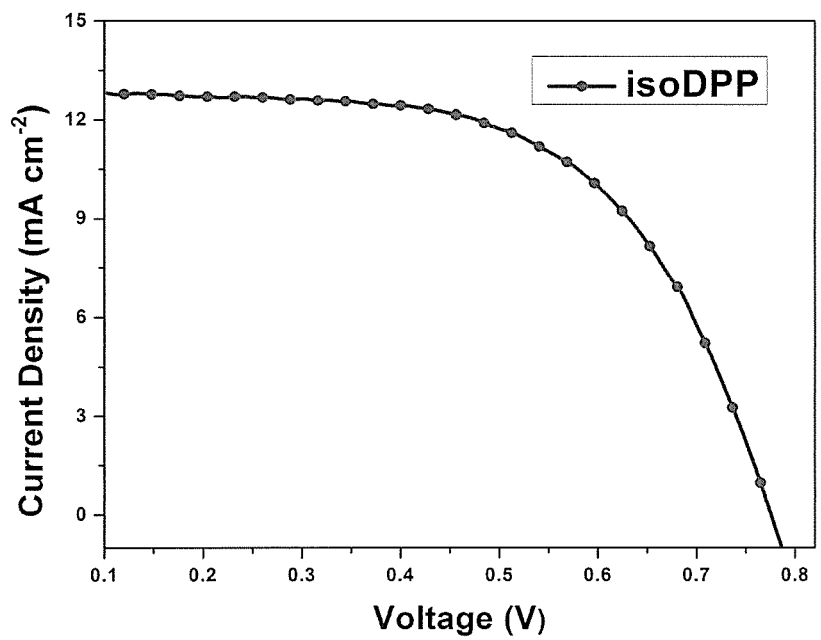
FIG. 2 is a J-V curve of a dye-sensitized solar cell of embodiment 3.

It can be seen from the data of FIG. 2 and Table 1 that the dye isoDPP presents a relatively high photoelectric conversion efficiency, and good short-circuit current and open-circuit voltage. This is because the dye has a relatively good light-harvesting ability and a very strong ability to inhibit aggregation.

What is claimed:

1. A pure organic dye with an isodiketopyrrolopyrrole group introduced in a π-bridge, comprising a general structural formula as follows:

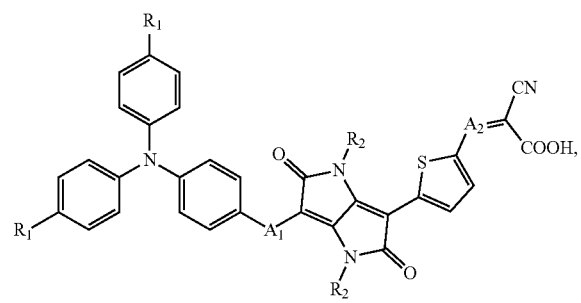

wherein, $R_1$ is $C_6H_{13}O$, $R_2$ is 2-ethylhexyl; and $A_1$ and $A_2$ are each a benzene ring.

2. A dye-sensitized solar cell comprising the pure organic dye with the isodiketopyrrolopyrrole group introduced in the π-bridge according to claim 1, consisting essentially of:
a conductive glass substrate, a photoanode, a sensitizer, an electrolyte and a counter electrode;
wherein a nano-porous $TiO_2$ film that can be used to absorb the sensitizer is provided in the middle of the conductive glass substrate on one side of a substrate work zone of the photoanode; the counter electrode is also called a photocathode, a catalyst layer is provided in the middle of the conductive glass substrate on one side of a substrate work zone of the photocathode,
wherein a catalyst of the catalyst layer is Pt; the photoanode and the photocathode are alternately configured opposite, the nano-porous $TiO_2$ film is sealed peripherally with a sealing material to form an airtight cavity, and the airtight cavity is filled with the electrolyte and the sensitizer, wherein the sensitizer is the pure organic dye with the isodiketopyrrolopyrrole group introduced in the π-bridge.

3. A method for preparing a dye-sensitized solar cell of claim 2, comprising preparation steps of:
(1) pretreatment of a conductive glass of FTO: ultrasonic cleaning a cut FTO and washing for 3-6 times with deionized water, and then soaking in a saturated ethanol solution of KOH for 16-36 h, followed by ultrasonic cleaning sequentially with deionized water, acetone, deionized water and ethanol, and keeping for use after drying;
(2) preparation of a photoanode: at room temperature, adding 35-80 mL of acetic acid and deionized water under intensive stirring to a mixed solution of 10-25 mL of $Ti(OBu)_2$ and 15-30 mL of EtOH, and continue to stir for 30 min to 2 h, transferring the mixed solution into an autoclave which is lined with polytetrafluoroethylene, treating at 200-280° C. for 8-20 h followed by natural cooling to room temperature, filtering an obtained suspension, sequentially washing for 3-6 times with deionized water and ethanol, drying in an oven at 40-60° C. for 4-8 h until dry to obtain $TiO_2$ nanocrystalline particles, respectively adding ethanol, acetic acid, terpilenol and ethyl cellulose into the prepared $TiO_2$ nanocrystalline particles, grinding the mixture thoroughly to obtain a muddy substance, and obtaining a white sticky $TiO_2$ nanocrystalline slurry as required through ultrasonic processing;
making a conductive plane of the treated conductive glass upward, placing a screen mesh sheet above the glass, controlling an off-contact distance to be 0.5-3 cm, placing the prepared $TiO_2$ nanocrystalline slurry on the screen mesh sheet to perform printing; putting the prepared photoanode into an oven for drying at 100-150° C., and then putting into a muffle furnace for sequential treatment at different temperatures: baking at 300-350° C. for 3-10 min, baking at 300-400° C. for 3-10 min, baking at 400-500° C. for 10-20 min, and baking at 450-550° C. for 10-20 min to fully remove an organic substance on the film, and subsequently soaking into a prepared 0.1-0.3 M $TiCl_4$ aqueous solution to treat for 30 min to 1.5 h, washing clean with deionized water and ethanol after the treatment is finished, putting into the muffle furnace and heating up to 450-550° C. to bake again for 25-40 min, and cooling to 60-80° C. for use;
(3) preparation of a dye solution: dissolving the isodiketopyrrolopyrrole dye into a mixed solvent of chloroform/methanol to formulate a dye solution of $1\times10^{-4}$ mol·$L^{-1}$ to $3\times10^{-4}$ mol·$L^{-1}$, with a volume ratio of chloroform/methanol of 4/1-1/4;
(4) preparation of an electrolyte solution: dissolving 0.5-0.7 M 1-methyl-3-propylimidazolium iodide (PMII), 0.03-0.07 M guanidine thiocyanate, 0.03-0.07 M LiI, 0.01-0.04 M I2 and 0.15-0.40 M tert-butyl pyridine (TBP) into acetonitrile, and mixing uniformly to obtain a clear solution;
(5) sensitization of the photoanode: soaking the photoanode prepared in step (2) into the dye solution prepared in step (3), taking the photoanode out and washing with the mixed solvent of chloroform/methanol to remove the residual on the surface or the dye on a film surface after performing a dye bath in a dark environment for 10-20 hours, and blow-drying followed by keeping the photoanode in a dry and dark environment for packaging and use; with the volume ratio of chloroform/methanol of 4/1-1/4; and
(6) making an adhesive tape into a suitable inner hole plastic by using a hole puncher, putting an insulative thin film on the sensitized photoanode to enable the photoanode to be exactly inside an inner hole of the insulative thin film, dropping 1-2 drops of the electrolyte solution prepared in step (4) onto a surface of the $TiO_2$ film, and covering a platinum counter electrode on the photoanode with two sides being fixed with clamps, and then an open dye-sensitized solar cell to be tested is formed.

* * * * *